United States Patent
Jun et al.

(10) Patent No.: US 9,756,725 B2
(45) Date of Patent: *Sep. 5, 2017

(54) COMPOSITION FOR FORMING CONDUCTIVE PATTERN AND RESIN STRUCTURE HAVING CONDUCTIVE PATTERN THEREON

(71) Applicant: LG CHEM, LTD., Seoul (KR)

(72) Inventors: Shin Hee Jun, Daejeon (KR); Chee-Sung Park, Daejeon (KR); Jae Hyun Kim, Daejeon (KR); Sang Yun Jung, Daejeon (KR); Cheol-Hee Park, Daejeon (KR); Han Nah Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/023,506

(22) PCT Filed: Nov. 24, 2014

(86) PCT No.: PCT/KR2014/011325
§ 371 (c)(1),
(2) Date: Mar. 21, 2016

(87) PCT Pub. No.: WO2015/076633
PCT Pub. Date: May 28, 2015

(65) Prior Publication Data
US 2016/0234933 A1  Aug. 11, 2016

(30) Foreign Application Priority Data

Nov. 25, 2013 (KR) ........................ 10-2013-0143811
Nov. 21, 2014 (KR) ........................ 10-2014-0163271

(51) Int. Cl.
*H05K 1/00* (2006.01)
*H05K 1/03* (2006.01)
(Continued)

(52) U.S. Cl.
CPC ............. *H05K 1/0326* (2013.01); *C08K 3/22* (2013.01); *C09D 5/24* (2013.01); *C09D 201/00* (2013.01);
(Continued)

(58) Field of Classification Search
CPC ...... H05K 1/0326; H05K 1/0373; H05K 3/10; C08K 3/22; C09D 5/24; H01B 1/22
(Continued)

(56) References Cited

U.S. PATENT DOCUMENTS 7,105,223 B2  9/2006  Kliesch et al.
8,309,640 B2  11/2012  Li et al.
(Continued)

FOREIGN PATENT DOCUMENTS

CN  1518850 A  8/2004
CN  101747650 A  6/2010
(Continued)

*Primary Examiner* — Tremesha S Willis
(74) *Attorney, Agent, or Firm* — Dentons US LLP

(57) ABSTRACT

The present invention relates to a composition for forming a conductive pattern which is capable of forming a fine conductive pattern on a variety of polymeric resin products or resin layers by a simplified process, while imparting excellent flame retardancy to the resin products or resin layers, and a resin structure having the conductive pattern obtained using the composition. The composition for forming a conductive pattern includes: a polymer resin; a non-conductive metal compound including a first metal element and a second metal element, having a R$\bar{3}$m or P6$_3$/mmc space group in crystal structure; and a flame retardant, wherein a metal nucleus including the first metal element, (Continued)

the second metal element or an ion thereof is formed from the non-conductive metal compound by the electromagnetic irradiation.

19 Claims, 7 Drawing Sheets

(51) Int. Cl.
    *C09D 5/24*     (2006.01)
    *C09D 201/00*     (2006.01)
    *H01B 1/22*     (2006.01)
    *H05K 3/00*     (2006.01)
    *H05K 3/10*     (2006.01)
    *C08K 3/22*     (2006.01)

(52) U.S. Cl.
    CPC ............ *H01B 1/22* (2013.01); *H05K 1/0373* (2013.01); *H05K 3/0055* (2013.01); *H05K 3/10* (2013.01); *H05K 2201/012* (2013.01); *H05K 2201/0129* (2013.01); *H05K 2201/0145* (2013.01); *H05K 2201/0158* (2013.01)

(58) Field of Classification Search
    USPC .............................. 174/258, 250, 255, 256
    See application file for complete search history.

(56) References Cited

U.S. PATENT DOCUMENTS

2009/0292048 A1    11/2009    Li et al.
2011/0281135 A1    11/2011    Gong et al.
2012/0279764 A1    11/2012    Jiang et al.
2015/0038633 A1*    2/2015    Shibutani ................ C08L 29/04
                                                524/503
2016/0128188 A1    5/2016    Jun et al.

FOREIGN PATENT DOCUMENTS

| | | |
|---|---|---|
| CN | 102066122 A | 5/2011 |
| EP | 2958112 A1 | 12/2015 |
| JP | 2000-31463 A | 1/2000 |
| JP | 2002-74311 A | 3/2002 |
| JP | 2002-158229 A | 5/2002 |
| JP | 2002-158418 A | 5/2002 |
| JP | 2008-230168 A | 10/2008 |
| JP | 2010536947 A | 12/2010 |
| JP | 2012524169 A | 10/2012 |
| JP | 2013515118 A | 5/2013 |
| KR | 1996-0000217 B1 | 1/1996 |
| KR | 10-2004-0021614 A | 3/2004 |
| KR | 10-2005-0030161 A | 3/2005 |
| KR | 10-0651519 B1 | 11/2006 |
| KR | 10-0716486 B1 | 5/2007 |
| KR | 10-2011-0009684 A | 1/2011 |
| KR | 10-2011-0018319 A | 2/2011 |
| KR | 10-2011-0112860 A | 10/2011 |
| KR | 10-2012-0121219 A | 11/2012 |
| KR | 10-2012-0124167 A | 11/2012 |
| KR | 10-2012-0125108 A | 11/2012 |
| KR | 10-2014-0128233 A | 11/2014 |
| KR | 10-2014-0128234 A | 11/2014 |
| TW | 201233272 A | 8/2012 |
| TW | 201527378 A | 7/2015 |
| WO | 2007/000833 A1 | 1/2007 |
| WO | 2009141799 A1 | 11/2009 |
| WO | 2015046840 A1 | 4/2015 |

\* cited by examiner

[FIG. 1]
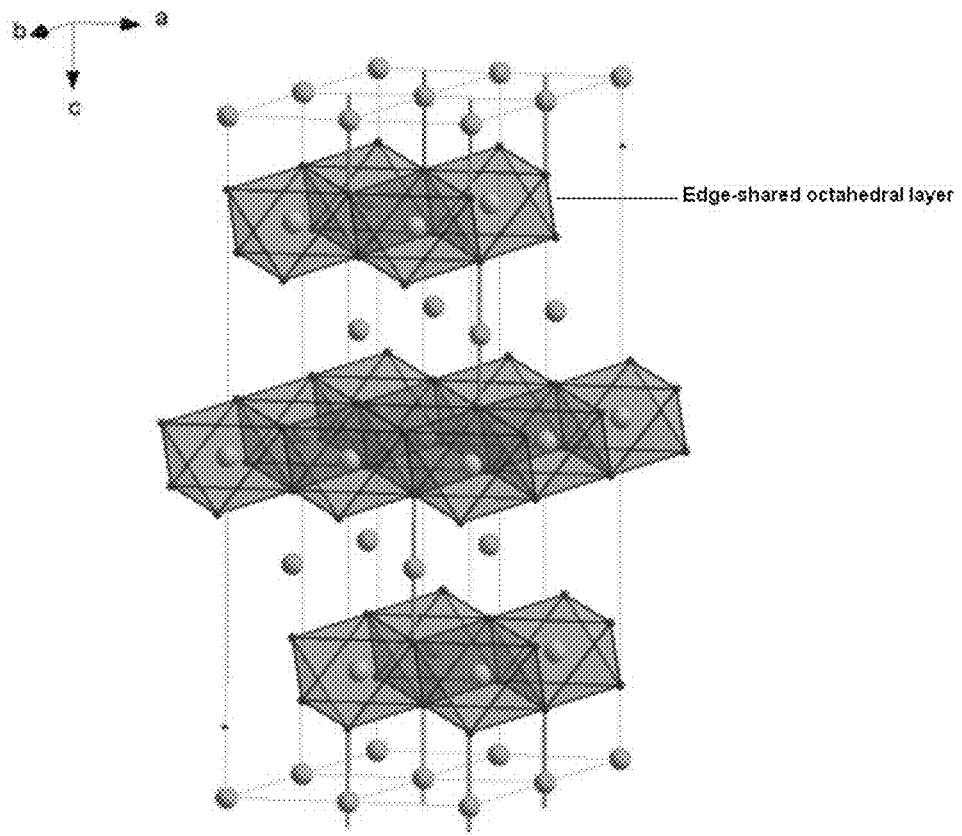

[FIG. 2]
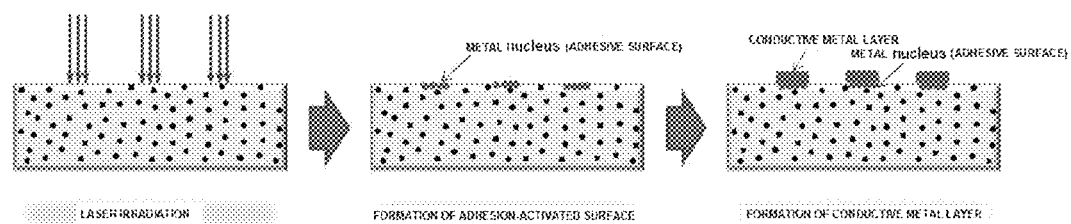
[FIG. 3]
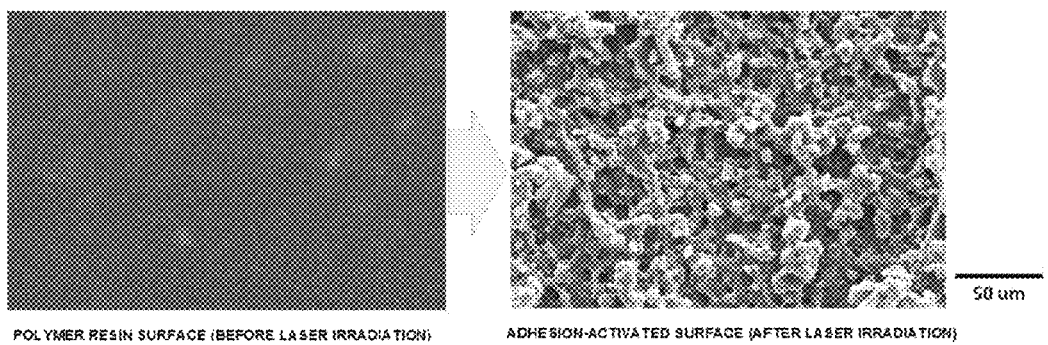

[FIG. 4]
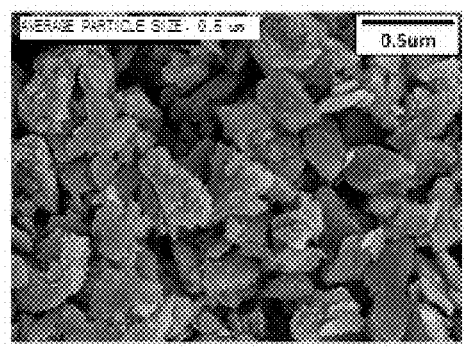
[FIG. 5]
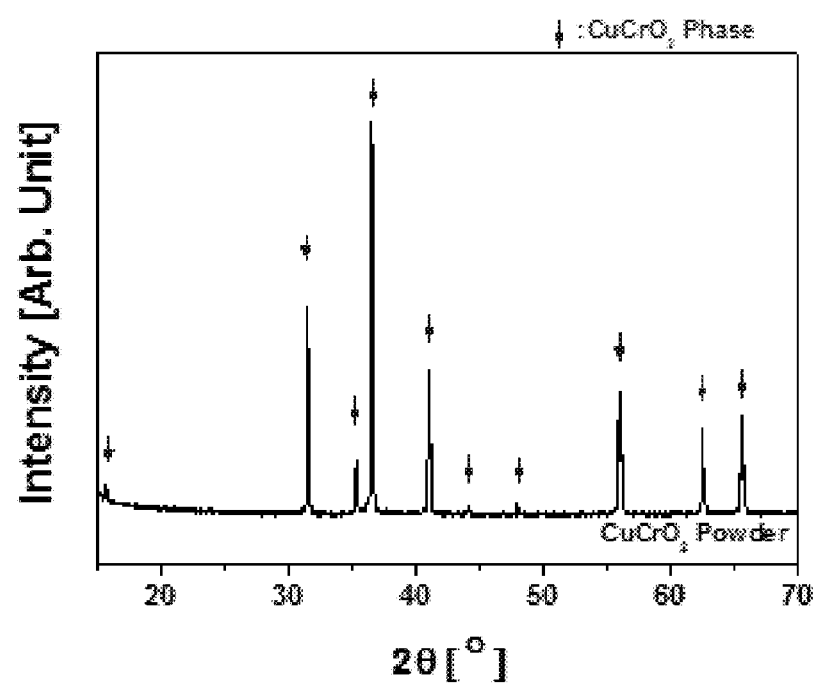

[FIG. 6]
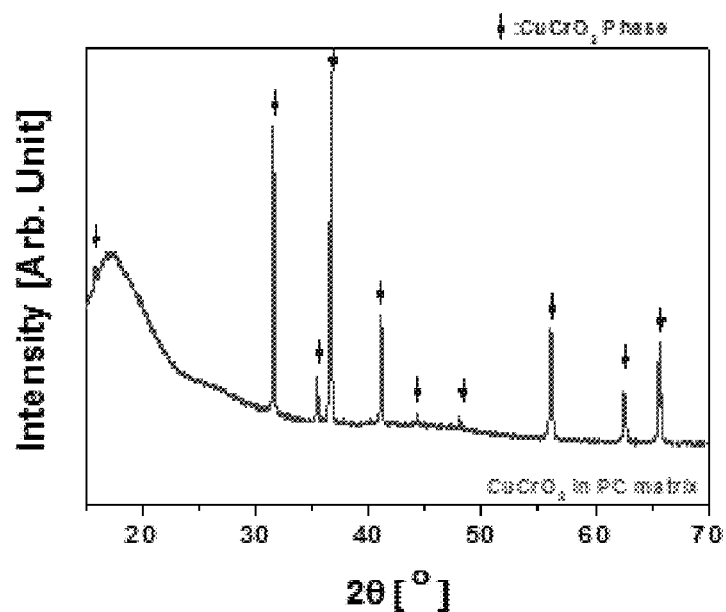
[FIG. 7]
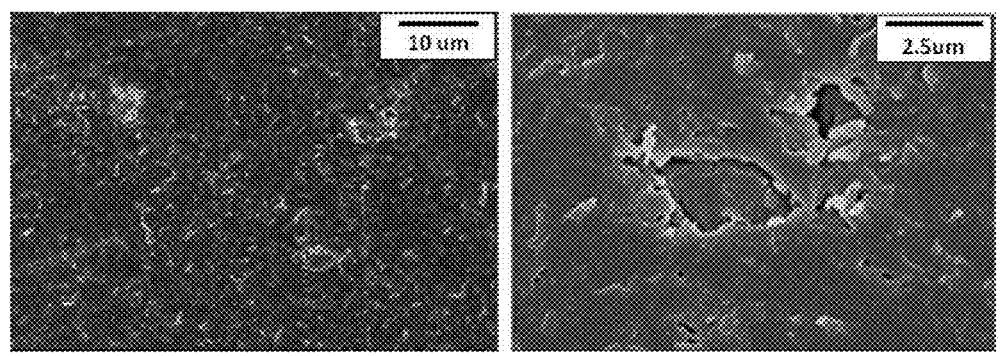

[FIG. 8]
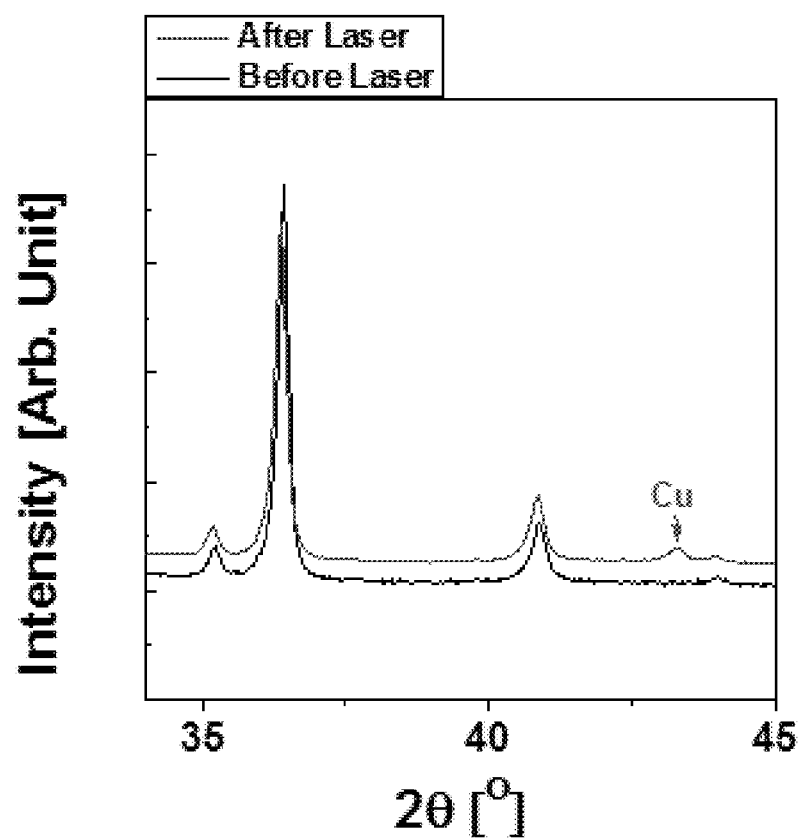

[FIG. 9]
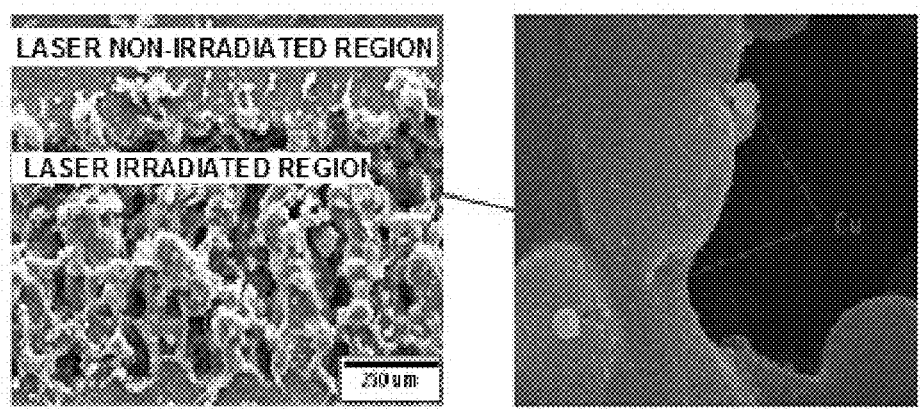
[FIG. 10]
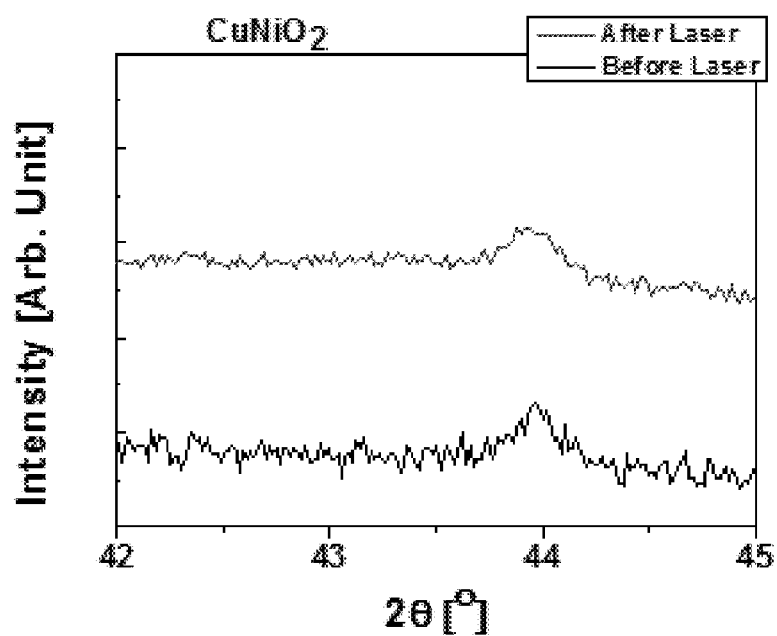

[FIG. 11]
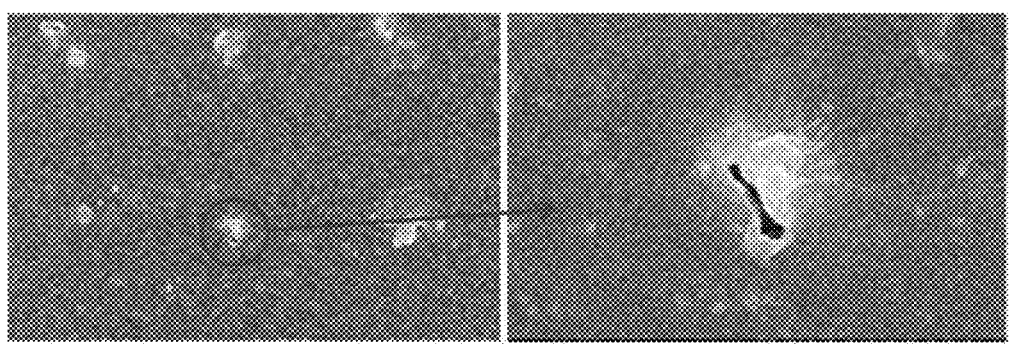

COMPOSITION FOR FORMING CONDUCTIVE PATTERN AND RESIN STRUCTURE HAVING CONDUCTIVE PATTERN THEREON

This application is a National Stage Entry of International Application No. PCT/KR2014/011325, filed on Nov. 24, 2014, and claims the benefit of and priority to Korean Application No. 10-2013-0143811, filed on Nov. 25, 2013, and Korean Application No. 10-2014-0163271, filed on Nov. 21, 2014, all of which are incorporated herein by reference in their entirety for all purposes as if fully set forth herein.

TECHNICAL FIELD

The present invention relates to a composition for forming a conductive pattern which is capable of forming an excellent fine conductive pattern on a variety of polymeric resin products or resin layers by a simplified process, while imparting excellent flame retardancy to the resin products or resin layers, and a resin structure having the conductive pattern obtained therefrom.

BACKGROUND

With the recent development of microelectronic technology, a need for structures having a fine conductive pattern formed on the surface of a polymeric resin substrate (or product) such as a variety of resin products or resin layers has grown. The conductive patterns on the surface of the polymeric resin substrate and the structure may be applied to form various objects such as antennas integrated into a mobile phone case, a variety of sensors, MEMS structures, RFID tags, and the like.

As such, with increasing interest in the technology of forming the conductive pattern on the surface of the polymeric resin substrate, several technologies regarding this have been suggested. However, a more effective method for these technologies has not been suggested yet.

For example, according to the previous technology, a method for forming the conductive pattern by forming a metal layer on the surface of the polymeric resin substrate and then applying photolithography, a method for forming the conductive pattern by printing a conductive paste, or the like may be considered. However, when the conductive pattern is formed according to this technology, there are limitations that a process or equipment to be needed becomes too complicated, or it is difficult to form an excellent fine conductive pattern.

Accordingly, there is a need to develop a technology capable of more effectively forming the fine conductive pattern on the surface of the polymeric resin substrate by a more simplified process.

In order to fulfill the demand in the art, a technology of forming the conductive pattern by using a composition including a specific non-conductive metal compound, and the like added to a polymeric resin, and performing direct irradiation of electromagnetic waves such as laser, has been suggested. According to this technology, the electromagnetic waves such as laser are directly irradiated onto a predetermined region of the composition to selectively expose metal components of the non-conductive metal compound, followed by electroless plating on the corresponding region, thereby forming the conductive pattern.

However, when the conductive pattern is formed by the above technology, the conductive pattern has poor adhesion strength to the polymeric resin substrate, such that a problem that it is difficult to form excellent conductive pattern, and the like, also occur.

In addition, in case where the conductive pattern on the surface of the polymeric resin substrate and the structure including the pattern are utilized as antennas of a laptop, a tablet PC, a mobile phone, a personal computer, and the like, it is necessary to impart flame retardancy to the polymeric resin substrate or the resin structure on which the conductive pattern is formed over a certain level. However, any related technologies such as a composition which is capable of effectively forming an excellent conductive pattern on the surface of the polymeric resin substrate by a more simplified process, while imparting excellent flame retardancy to the resin substrate or the structure, have not been suggested yet.

SUMMARY OF THE INVENTION

The present invention provides a composition for forming a conductive pattern which is capable of forming an excellent fine conductive pattern on a variety of polymeric resin products or resin layers by a simplified process, while imparting excellent flame retardancy to the resin products or resin layers.

In addition, the present invention provides a resin structure having the conductive pattern which is formed from the composition for forming the conductive pattern, or the like An exemplary embodiment of the present invention provides a composition for forming a conductive pattern by electromagnetic irradiation, including: a polymer resin; a non-conductive metal compound including a first metal element and a second metal element, having a R$\bar{3}$m or P6$_3$/mmc space group in crystal structure; and a flame retardant, wherein a metal nucleus including the first metal element, the second metal element or an ion thereof is formed from the non-conductive metal compound by the electromagnetic irradiation.

Specific examples of the non-conductive metal compound may include one or more compounds selected from the group consisting of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$ and $CuSnO_2$, such that the metal nucleus may be formed well by electromagnetic irradiation to form a better conductive pattern.

In addition, the composition for forming a conductive pattern may exhibit reflectivity of 25% or less, or approximately 10 to 25%, with respect to a laser electromagnetic wave having a wavelength of approximately 1000 nm to 1200 nm.

Further, in the composition for forming a conductive pattern, the metal nucleus may be formed by irradiating a laser electromagnetic wave having a wavelength of approximately 1000 nm to 1200 nm at an average power of approximately 5 to 20 W. By controlling the irradiation conditions of laser electromagnetic wave, the metal nucleus may be more effectively formed on the polymeric resin of the composition, and therefore, a better conductive pattern may be formed.

In addition, in the composition for forming a conductive pattern, the polymeric resin may include a thermosetting resin or a thermoplastic resin, and specific examples thereof may include one or more selected from the group consisting of an ABS resin, a polyalkylene terephthalate resin such as a polybutyleneterephthalate resin, a polyethyleneterephthalate resin, or the like, a polycarbonate resin, a polypropylene resin, and a polyphthalamide resin.

Further, in the composition for forming the conductive pattern, the non-conductive metal compound may be included in an amount of approximately 0.1 to 10 wt %, with respect to the total composition.

In addition, in the composition for forming the conductive pattern, the flame retardant may include an phosphorus-containing organic flame retardant or an inorganic flame retardant, and more specific examples thereof may include one or more phosphorus-containing organic flame retardant selected from the group consisting of trialkyl phosphate, alkyldiaryl phosphate, triacryl phosphate and resorcinol bisphenyl phosphate, or one or more inorganic flame retardant selected from the group consisting of metal hydrides, antimony oxide and metal sulfonates.

The flame retardant may be included in an amount of approximately 0.1 to 20 wt % with respect to the total composition, thereby imparting excellent flame retardancy to the composition for forming the conductive pattern and the resin structure formed therefrom, without reducing the impact strength or the rheological property of the composition.

Meanwhile, the composition for forming the conductive pattern may further include one or more additives selected from the group consisting of a heat stabilizer, a UV stabilizer, a lubricant, an antioxidant, an inorganic filler, a colorant, an impact modifier, and a functional modifier, in addition to the above-described polymeric resin, the predetermined non-conductive metal compound and a flame retardant.

More specifically, in case of including the phosphorus-containing organic flame retardant as the flame retardant, it is appropriate for the composition for forming the conductive pattern to further include the inorganic filler or the impact modifier as the additive.

Meanwhile, according to still another embodiment, there is provided a resin structure having the conductive pattern which is obtained from the above-described composition for forming the conductive pattern. The resin structure may include a polymeric resin substrate; non-conductive metal compound including a first metal element and a second metal element, having a R$\bar{3}$m or P6$_3$/mmc space group in crystal structure, and dispersed in the polymeric resin substrate; a flame retardant dispersed in the polymeric resin substrate; an adhesion-activated surface including a metal nucleus including a first or a second metal element or an ion thereof exposed on a surface of a predetermined region of the polymeric resin substrate; and a conductive metal layer formed on the adhesion-activated surface.

In the resin structure, the predetermined region in which the adhesion-activated surface and the conductive metal layer are formed may correspond to the region of the polymeric resin substrate to which the electromagnetic wave is irradiated.

Further, the resin structure may exhibit a flame retardant grade of UV 94-V0 or V1 (thickness (t) is 0.6 to 1.6 mm).

In addition, in the resin structure, the conductive metal layer may be formed on the polymeric resin substrate by excellent adhesion strength at which a delamination area of the metal layer is 0% (ISO Class 0 grade), or more than 0% to 5% or less (ISO Class 1 grade), of an area of a target metal layer under test, when tested according to the ISO 2409 standard.

Advantageous Effect

According to the present invention, a composition for forming a conductive pattern which is capable of forming a fine conductive pattern on a polymeric resin substrate such as a variety of polymeric resin products or resin layers by a very simplified process of electromagnetic irradiation such as laser irradiation, a method for forming the conductive pattern using the same, and a resin structure having the conductive pattern obtained therefrom may be provided.

In particular, as the composition for forming the conductive pattern according to the present invention and the like use a non-conductive metal compound having a specific three-dimensional structure, and the like, an excellent fine conductive pattern having excellent adhesion strength may be more effectively formed.

Moreover, the resin structure may show excellent flame retardancy required in case of being applied to antennas of a laptop, a tablet PC, a mobile phone, a personal computer, and the like, and also simultaneously excellent physical properties by inhibiting the reducing of impact strength and a rheological property caused by additives such as the flame retardant.

Therefore, the composition for forming the conductive pattern or the resin structure having the conductive pattern manufactured therefrom may be used to very effectively form a conductive pattern for antennas on a variety of resin products such as a laptop, a tablet PC, a computer, a mobile phone case, and the like, RFID tags, various sensors, MEMS structures, and the like.

DESCRIPTION OF DRAWINGS

FIG. 1 is a drawing schematically illustrating an exemplary three-dimensional structure of a non-conductive metal compound included in a composition for forming a conductive pattern according to one exemplary embodiment of the present invention.

FIG. 2 is a drawing briefly illustrating a schematic diagram showing each step of an exemplary method for forming a conductive pattern according to another exemplary embodiment of the present invention.

FIG. 3 is an electron micrograph showing an adhesion-activated surface including a metal nucleus, which is formed on a surface of a polymeric resin substrate by electromagnetic irradiation in an exemplary method for forming a conductive pattern according to another exemplary embodiment of the present invention.

FIGS. 4 and 5 show an electron micrograph and X-ray diffraction pattern of $CuCrO_2$ powder obtained in Preparation Example 1, respectively.

FIGS. 6 and 7 show a result of X-ray diffraction analysis and an electron micrograph of a fracture surface of a resin substrate, after the resin substrate including $CuCrO_2$ particles was obtained in Example 1, respectively.

FIGS. 8 and 9 show a result of X-ray diffraction analysis and an electron micrograph to examine whether the metal nucleus and the adhesion-activated surface including the metal nucleus are formed on the surface of the polymeric resin substrate after laser irradiation in Example 1, respectively.

FIGS. 10 and 11 show a result of X-ray diffraction analysis to examine whether the metal nucleus is formed on the resin structure after laser irradiation in Comparative Example 2 and a result to examine an electron micrograph of the laser-irradiated surface, respectively.

DETAILED DESCRIPTION OF THE EMBODIMENTS

Hereinafter, a composition for forming a conductive pattern, a method for forming the conductive pattern using the same, and a resin structure having the conductive pattern according to specific exemplary embodiments of the present invention will be described.

According to one exemplary embodiment of the present invention, there is provided a composition for forming a conductive pattern by electromagnetic irradiation, including: a polymer resin; a non-conductive metal compound including a first metal element and a second metal element, having a R$\overline{3}$m or P6$_3$/mmc space group in crystal structure; and a flame retardant, wherein a metal nucleus including the first metal element, the second metal element or an ion thereof is formed from the non-conductive metal compound by the electromagnetic irradiation.

The composition for forming a conductive pattern includes a non-conductive metal compound having a specific three-dimensional structure defined by a R$\overline{3}$m or P6$_3$/mmc space group in crystal structure, and an exemplary three-dimensional structure of the non-conductive metal compound is schematically illustrated in FIG. 1.

Referring to FIG. 1, the non-conductive metal compound may have the three-dimensional structure which includes a plurality of first layers (edge-shared octahedral layers) including at least one metal of the first and the second metal element and having a structure in which octahedrons sharing edges are two-dimensionally connected to each other, and a second layer including different metal from that of the first layer and arranged between the neighboring first layers, and the three-dimensional structure may be referred to as the R$\overline{3}$m or P6$_3$/mmc space group in crystal structure.

After the composition for forming a conductive pattern including the particles of the non-conductive metal compound is used to mold a polymeric resin product or a resin layer, and an electromagnetic wave such as laser, or the like, is irradiated, a metal nucleus including the first or the second metal element or the ion thereof may be formed from the non-conductive metal compound. The metal nucleus may be selectively exposed on the predetermined region to which the electromagnetic wave is irradiated to form the adhesion-activated surface on the surface of the polymeric resin substrate. Then, when performing electroless plating with a plating solution including conductive metal ions, and the like, using the metal nucleus, and the like, including the first, the second metal element or the ion thereof, as a seed, the conductive metal layer may be formed on the adhesion-activated surface including the metal nucleus. Through this process, the conductive metal layer, in other words, fine conductive pattern may be selectively formed only on the predetermined region of the polymeric resin substrate, to which the electromagnetic wave is irradiated.

In particular, one of the factors in which the metal nucleus and the adhesion-activated surface may be formed and therefore, a better conductive pattern may be formed by electromagnetic irradiation is the specific three-dimensional structure of non-conductive metal compound included in the composition of one exemplary embodiment, for example, the three-dimensional structure schematically shown in FIG. 1.

In the three-dimensional structure of non-conductive metal compound, at least one metal element of the first and second metals forming the three-dimensional structure is included in the first layers, wherein the first layer (edge-shared octahedral layer) has a structure in which octahedrons sharing edges are two-dimensionally connected to each other. In addition, the three-dimensional structure of non-conductive metal compound includes the second layer arranged between the neighboring first layers, together with a plurality of the above-described first layers. The second layer includes a metal different from that of the first layer, for example, the remaining metal element of the first and second metals which is not included in the first layer, and the metals of the second layer connect vertices of the octahedrons to each other between the neighboring first layers, thereby connecting two-dimensional structures thereof to each other.

In more specific exemplary embodiment, the non-conductive metal compound having the layered three-dimensional structure may include X (oxygen, nitrogen, or sulfur) together with the first and the second metal elements to be a compound represented by a general formula ABX$_2$ (A and B are independently of each other, a first and a second metal elements, and X is oxygen, nitrogen, or sulfur). In the compound having the general formula, at least one metal of the first and the second metal elements and X atoms may form the octahedrons sharing edges, and the octahedrons may be arranged in the two-dimensionally connected structure, thereby forming the first layer. In addition, as described above, the remaining metal not included in the first layer may form the second layer between the neighboring first layers, and the metal forming the second layer may connect the two-dimensionally connected structure thereof to each other between the first layers.

Here, the first or the second metal element forming the second layer may be one or more metal elements selected from the group consisting of Cu, Ag and Ni, which may be released from the non-conductive metal compound by electromagnetic irradiation. Further, the first or the second metal element forming the first layer may be one or more metal elements selected from the group consisting of Cr, Mo, Mn, Fe, Sn and W, which are different from the metal element forming the second layer.

Before electromagnetic irradiation, the non-conductive metal compound having the particular layered three-dimensional structure as described above exhibits non-conductivity and has excellent compatibility with the polymeric resin, and also is chemically stable in the solution used in reduction or plating treatment so as to maintain non-conductivity. Therefore, the non-conductive metal compound is uniformly blended with the polymeric resin substrate and maintains chemically stable state to exhibit non-conductivity in the region to which electromagnetic wave is not irradiated.

In contrast, the first, second metal element, or the ion thereof, and the like, may be easily generated from the non-conductive metal compound in the predetermined region to which electromagnetic wave such as laser, or the like, is irradiated Here, it is expected that easy release of the metal or ion thereof from the non-conductive metal compound is attributed to the layered three-dimensional structure in which the first layer and the second layer are sequentially arranged in the non-conductive metal compound as described above. Since the non-conductive metal compound having the layered three-dimensional structure has lower vacancy formation energy of the second layer as compared to a compound having a non-layered three-dimensional structure, the first or second metal element or the ion thereof included in the second layer may be more easily released. As such, the metal or the ion thereof is more easily released from the non-conductive metal compound by electromagnetic irradiation, which is one of the main factors causing formation of the metal nucleus and the adhesion-activated surface.

However, the experimental results of the present inventors confirmed that the formation of the metal nucleus and the adhesion-activated surface is not attributed only to the specific three-dimensional structure of the non-conductive metal compound. As a result of continuous experiments and study, the present inventors found that among the non-conductive metal compounds of the above specific three-dimensional structure, for example, a specific compound such as $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$, $CuSnO_2$, or the like, is selected and included, and therefore, the compound of one exemplary embodiment is capable of exhibiting higher absorption and sensitivity with respect to electromagnetic wave such as laser, or the like, at a specific wavelength. In addition, it was also found that when controlling the irradiation conditions of the electromagnetic wave such as laser, or the like, to be described below, the metal nucleus and adhesion-activated surface may be finally formed, and a better fine conductive pattern may be formed by electromagnetic irradiation such as laser, subsequent reduction, plating treatment, and the like.

Unlike the exemplary embodiment, when even though the composition for forming a conductive pattern has the above-described layered three-dimensional structure, inappropriate non-conductive metal compound such as $CuNiO_2$, or the like, described in Comparative Example to be described below is used, or the irradiation conditions of the electromagnetic wave such as laser, or the like, are not controlled at an appropriate range, the metal nucleus may not be formed, or the adhesion-activated surface including the metal nucleus and having larger roughness may not be properly formed, and excellent conductive pattern having excellent adhesion strength with the polymeric resin may not be formed.

Therefore, due to the above specific three-dimensional structure of the non-conductive metal compound, and properties thereof, and control of the above-described all conditions for forming the metal nucleus and accordingly, the adhesion-activated surface, the composition for forming the conductive pattern of one exemplary embodiment is capable of easily forming better fine conductive pattern, as compared to other compositions including a compound having a different three-dimensional structure such as spinel, or other compositions without metal nucleus formation. In addition, due to the property, when using the composition for forming the conductive pattern of one exemplary embodiment, excellent and fine conductive metal layer may be more easily formed even in case of decreasing an amount of the used non-conductive meal compound, more specifically, an amount or a content of the used first or the used second metal element, as compared to cases using other compositions including the non-conductive metal compounds having the non-layered three-dimensional structure such as the spinel, and the like.

Moreover, as the composition of one exemplary embodiment includes a flame retardant together with the non-conductive metal compound, the resin structure having the conductive pattern formed therefrom may show excellent flame retardancy required in case where it is applied to antennas of a laptop, a tablet PC, a mobile phone, a personal computer, and the like. In addition, as described below, considering the kinds of other components of the composition of one exemplary embodiment, the kind and content of the flame retardant are controlled, and thus, the reducing of the physical properties such as the impact strength, the rheological property, and the like of the resin structure may be inhibited by the additive such as flame retardant.

Eventually, when using the composition of one exemplary embodiment, an excellent fine conductive pattern may be very effectively formed on the resin structure or a resin product by a more simplified process, while their excellent physical properties may be maintained. Therefore, the composition of one exemplary embodiment may be much preferably applied to a variety of the resin products or the resin structures on which the conductive patters should be formed.

Meanwhile, the composition for forming the conductive pattern of one exemplary embodiment as described above may exhibit reflectivity of approximately 25% or less or approximately 10 to 25% with respect to a laser electromagnetic wave having a wavelength corresponding to the infrared region, for example, having a wavelength of approximately 1000 nm to 1200 nm, or approximately 1060 nm to 1070 nm, for example, approximately 1064 nm.

The relatively low reflectivity with respect to the laser electromagnetic wave may reflect high absorption and sensitivity with respect to the laser electromagnetic wave generally applied at the time of forming the metal nucleus and the sequential conductive pattern. Therefore, when using the composition for forming the conductive pattern of one exemplary embodiment showing the above-described range of low reflectivity, the metal nucleus and the adhesion-activated surface including the metal nucleus and having larger roughness may be more properly formed, and as a result, it is possible to form better conductive pattern.

In addition, the low reflectivity of the composition for forming the conductive pattern may be achieved by using the non-conductive metal compounds having the above-described specific three-dimensional structure, in particular, by using the specific compounds such as $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$, $CuSnO_2$, and the like, and by combinations of the specific non-conductive metal compounds with appropriate polymeric resins to be describes below, compositions thereof, and the like.

Meanwhile, in the composition for forming the conductive pattern as described above of one exemplary embodiment, the laser electromagnetic wave having a wavelength corresponding to the infrared region, for example, having a wavelength of approximately 1000 nm to 1200 nm, or approximately 1060 nm to 1070 nm, or approximately 1064 nm is irradiated at an average power of approximately 5 to 20 W, or approximately 7 to 15 W, such that the metal nucleus may be formed in a portion to which the electromagnetic wave is irradiated. As the irradiation condition of the electromagnetic wave such as laser, or the like, is controlled by the above-described range, the metal nucleus, the adhesion-activated surface including the metal nucleus and large roughness, and the like may be significantly well formed in the portion to which the laser is irradiated, and therefore, it is possible to form better conductive pattern. However, the irradiation conditions of the electromagnetic wave which allows the metal nucleus, and the like, to be formed, may be differently controlled depending on the specific kinds of non-conductive metal compounds and polymeric resins to be actually used, or compositions thereof.

In addition, the non-conductive metal compound may be in the form of particles having a particle size in a range of, for example, approximately 0.1 to 20 µm, or approximately 0.3 to 10 µm. Due to the average particle size, the mechanical properties such as the impact strength and the like of the resin structure formed from the composition of one exemplary embodiment may be excellently maintained, and the formation of the excellent conductive pattern having better adhesion strength is possible.

Meanwhile, in the composition for forming the conductive pattern of one exemplary embodiment as described above, any thermosetting resin or thermoplastic resin capable of forming various polymeric resin products or resin layers may be used as the polymeric resin, without specific limitation. In particular, the non-conductive metal compound having the above-described specific three-dimensional structure and particle size may exhibit excellent compatibility with various polymer resins and uniform dispersibility, and may hardly deteriorate physical properties such as impact strength, and the like, of the polymeric resin. Therefore, the composition of one exemplary embodiment may include various polymeric resins and may be molded into various resin products or resin layers. Specific examples of the polymeric resin may include an ABS resin, a polyalkylene terephthalate resin such as a polybutyleneterephthalate resin, a polyethyleneterephthalate resin, or the like, a polycarbonate resin, a polypropylene resin, a polyphthalamide resin, and the like, and may include various polymeric resins in addition thereto. Among the specific examples, the ABS resin or the polycarbonate resin is preferably used as the polymeric resin so as to more preferably guarantee the formation of the metal nucleus and excellent conductive pattern.

In addition, in the composition for forming the conductive pattern, the non-conductive metal compound may be included in an amount of approximately 0.1 to 10 wt % or approximately 0.5 to 7 wt %, with respect to the total composition, and the polymeric resin, the flame retardant described below and the like may be included in the remaining amount. According to the above-described amount range, basic physical properties such as the strength of the polymeric resin products or the resin layers formed from the composition may be excellently maintained, and the conductive pattern may be preferably formed on a predetermined region by the electromagnetic wave irradiation. As previously described, the composition of one exemplary embodiment may include the non-conductive metal compound having the specific three-dimensional structure and the like, such that even though the non-conductive metal compound has lower content, the metal nucleus and the conductive pattern having excellent adhesion strength may be favorably formed by the electromagnetic wave. Therefore, by decreasing the content of the non-conductive metal compound, basic physical properties of the resin products or the resin layers may be more excellently maintained, and colors of the additives may be hidden, whereby polymeric resin products showing various colors may be easily provided.

Further, the composition for forming the conductive pattern may further include a flame retardant, in addition to the above-described polymeric resin and the predetermined non-conductive metal compound. The flame retardant may impart excellent flame retardancy required in case where the resin structure having the conductive pattern formed from the composition of one exemplary embodiment is applied to antennas of a laptop, a tablet PC, a mobile phone, a personal computer, and the like.

More specifically, a phosphorus-containing organic flame retardant or an inorganic flame retardant may be used as the flame retardant. As such kinds of the flame retardant is included, considering the polymeric resin, the non-conductive metal compound, or the like included in the composition of one exemplary composition, excellent flame retardancy is imparted to the resin structure, without inhibiting the reducing of the physical properties such as the impact strength, the rheological property, or the like of the polymeric resin or the resin structure, which is caused by the decomposition of the polymeric resin or the resin structure, resulted from the addition of the flame retardant, and the like.

The more specific examples of the phosphorus-containing organic flame retardant of the flame retardant may include one or more phosphorus-containing compounds selected from the group consisting of trialkyl phosphate, alkyldiaryl phosphate, triacryl phosphate and resorcinol bisphenyl phosphate. Further, the more specific examples of the inorganic flame retardant may include one or more inorganic retardant selected from the group consisting of metal hydrides such as $Mg(OH)_2$, antimony oxide and metal sulfonates, for example, a potassium sulfonate-based salt such as potassium bisphenyl sulphone-3-sulfonate. In addition, by using various phosphorus-containing organic flame retardant or inorganic flame retardant, the flame retardancy of the resin structure manufactured from the composition of one exemplary embodiment may be property imparted, while the reducing the physical properties such as impact strength, a rheological property may be inhibited.

The flame retardant may be included in an amount of approximately 0.1 to 20 wt %, thereby imparting excellent flame retardancy to the composition for forming the conductive pattern and the resin structure formed therefrom, without reducing impact strength or a rheological property of the composition. More specifically, the phosphorus-containing flame retardant of the flame retardant may be included in an amount of approximately 1 to 20 wt %, or approximately about 3 to 15 wt %, with respect to the total composition. Further, the inorganic retardant may be included in an amount generally used before, depending on the specific kinds of the flame retardant materials and the polymeric resins. The appropriate content range of each inorganic flame retardant depending on the kind of each polymeric resin has been already known to a person skilled in the art, and since the content range may be different from the specific kinds of the inorganic flame retardant, any additional description thereof will be omitted.

In case where the content of each kind of the flame retardant is too high, the addition of the flame retardant causes decomposition from the reaction with the polymeric resin such as polycarbonate resin, such that the physical properties such as the impact strength or the rheological property of the resin structure formed from the composition of one exemplary embodiment may be reduced, and thus, such case is not preferable. On the contrary, in case where the content of the flame retardant is too low, the flame retardancy of the resin structure obtained from the composition of one exemplary embodiment may not be sufficient.

Meanwhile, the composition of one exemplary embodiment as described above may further include one or more additives selected from the group consisting of a heat stabilizer, a UV stabilizer, a lubricant, an antioxidant, an inorganic filler, a colorant, an impact modifier, and a functional modifier, in addition to the above-described polymeric resin, the non-conductive metal compound and the flame retardant. By the addition of the additives, the physical properties of the resin structure obtained from the composition of one exemplary embodiment may be properly reinforced. Among those additives, the colorant, for example, a pigment may be included in an amount of approximately 0.1 to 10 wt %, so as to impart the desired color to the resin structure, while properly hiding the distinctive color of the non-conductive metal compound. In addition, the impact modifier, the heat stabilizer, the UV stabilizer, the lubricant, or the antioxidant may be included in an amount of approximately 0.01 to 5 wt %, or approximately 0.05 to 3 wt %, so as to properly express the desired physical properties in the resin structure.

Meanwhile, in case where the composition of one exemplary embodiment includes the phosphorus-containing organic flame retardant, among the above-described flame retardant, it is appropriate for the composition to further include the inorganic filler of the impact modifier as the additive. As described above, though the inorganic flame retardant may impart excellent flame retardancy to the resin structure even with the addition of a small amount of approximately 2 wt % or less, the phosphorus-containing organic flame retardant may impart appropriate flame retardancy only with the addition of relatively large amount. Accordingly, there is relatively high probability that the phosphorus-containing organic flame retardant may react with the polymeric resin to cause decomposition and reduced physical properties. Thus, when adding the phosphorus-containing organic flame retardant, the inorganic filler or the impact modifier may be also added, thereby further improving the physical properties.

Meanwhile, hereinafter, a method for forming the conductive pattern on the polymeric resin substrate such as the resin product, the resin layer, or the like, by direct electromagnetic irradiation, using the above-described composition for forming the conductive pattern of one exemplary embodiment, will be described in detail. The method for forming the conductive pattern according to another exemplary embodiment may include molding the composition for forming a conductive pattern as described above into a resin product or applying the composition to another product so as to form a resin layer; irradiating an electromagnetic wave to a predetermined region of the resin product or the resin layer so as to generate a metal nucleus including a first or a second metal element or an ion thereof from the non-conductive metal compound; and chemically reducing or plating the region in which the metal nucleus is generated so as to form a conductive metal layer.

Each step of the method for forming the conductive pattern will be described with reference to the accompanying drawings. For reference, FIG. 2 schematically illustrates one example of the method for forming the conductive pattern, which includes steps of irradiating an electromagnetic wave to the predetermined region of the resin product or the resin layer (the polymeric resin substrate) (that is, forming the metal nucleus and the adhesion-activated surface including the metal nucleus; first and second drawings), and forming the conductive metal layer (a third drawing). In addition, FIG. 3 is an electron micrograph showing the metal nucleus and the adhesion-activated surface including the metal nucleus that are formed on the surface of the predetermined region of the polymeric resin substrate by electromagnetic irradiation, in one example of the method for forming the conductive pattern.

In the method for forming the conductive pattern, first, the above-described composition for forming the conductive pattern may be molded into the resin product, or applied to another product so as to form the resin layer. In the molding of the resin product or the forming of the resin layer, general methods for molding products using polymeric resin compositions or general methods for forming resin layers may be applied without specific limitation. For example, in the molding of the resin product using the composition, the composition for forming the conductive pattern is extruded and cooled to form pellets or particles, which are subjected to injection molding to have a desired shape, thereby manufacturing various polymeric resin products.

The polymeric resin product or the resin layer thus formed may have the above-described non-conductive metal compound of the specific three-dimensional structure and the like as described above which are uniformly dispersed on the resin substrate formed from the polymeric resin. In particular, since the non-conductive metal compound has excellent compatibility with various polymeric resins, and chemical stability, it may be uniformly dispersed throughout the resin substrate and maintain non-conductivity.

After forming the polymeric resin product or the resin layer, as illustrated in the first drawing of FIG. 2, an electromagnetic wave such as laser, or the like, may be irradiated to the predetermined region of the resin product or the resin layer, on which the conductive pattern is intended to be formed. When the electromagnetic wave is irradiated, the first or second metal element or the ion thereof may be released from the non-conductive metal compound, and the metal nucleus including the first or the second metal element or the ion thereof may be generated, and the adhesion-activated surface including the metal nucleus may be formed (see, a second drawing of FIG. 2).

More specifically, when the step of generating metal nucleus by electromagnetic irradiation is carried out, a part of the non-conductive metal compound is exposed on the surface of the predetermined region of the resin product or the resin layer, and the metal nucleus is generated therefrom, and thus the adhesion-activated surface which is activated to have higher adhesion strength may be formed (see FIG. 3). The adhesion-activated surface may include the metal nucleus while having large roughness. As the adhesion-activated surface is selectively formed only on the specific region to which the electromagnetic wave is irradiated, and after a plating step, and the like, to be described below, the conductive metal ions are chemically reduced by chemical reduction of the first or second metal ions included in the metal nucleus and the adhesion-activated surface, and/or by electroless plating thereof, such that the conductive metal layer may be selectively more favorably formed on the predetermined region of the polymeric resin substrate. More specifically, upon electroless plating, the metal nucleus function as a kind of seed to form a strong bonding with the conductive metal ions included in the plating solution, when the conductive metal ions are chemically reduced. As a result, the conductive metal layer may be selectively formed in an easier manner.

In particular, as the non-conductive metal compound has the above-described certain three-dimensional structure, it may be more sensitively reacted even under the irradiation of the electromagnetic wave such as relatively low powered laser, or the like, such that the adhesion-activated surface having larger roughness and the metal nucleus may be effectively formed, and the conductive metal layer (conductive pattern) having improved adhesion strength may be formed on the resin products or the resin layers from the adhesion-activated surface and the metal nucleus.

Meanwhile, in the step of generating the metal nucleus as described above, among the electromagnetic wave, the laser electromagnetic wave may be irradiated, for example, the laser electromagnetic wave having a wavelength corresponding to the infrared region, for example, having a wavelength of approximately 1000 nm to 1200 nm, or approximately 1060 nm to 1070 nm, or approximately 1064 nm may be irradiated at an average power of approximately 5 to 20 W, or approximately 7 to 15 W.

By the irradiation of the laser electromagnetic wave, the formation of the metal nucleus from the non-conductive metal compound may be more preferably guaranteed, and the adhesion-activated surface including the metal nucleus may be selectively generated and exposed on the predetermined region.

Meanwhile, after the above-described step of generating the metal nucleus, the step of forming the conductive metal layer by chemically reducing or plating the region in which the metal nucleus is formed may be carried out, as illustrated in a third drawing of FIG. 2. As a result of the reducing or the plating step, the conductive metal layer may be selectively formed on the predetermined region in which the metal nucleus and the adhesion-activated surface are exposed, and on the other region, the chemically stable non-conductive metal compound may maintain non-conductivity as it is. Therefore, the fine conductive pattern may be selectively formed only on the predetermined region of the polymeric resin substrate.

More specifically, the step of forming the conductive metal layer may proceed by electroless plating, and therefore, excellent conductive metal layer may be formed on the adhesion-activated surface.

In one example, in the reducing or the plating step, the predetermined region of the resin product or the resin layer in which the metal nucleus is generated may be treated with an acidic or basic solution including a reducing agent, and the solution may include one or more selected from the group consisting of formaldehyde, hypophosphite, dimethylamino borane (DMAB), diethylamino borane (DEAB) and hydrazine as the reducing agent. In addition, in the reducing or the plating step, the conductive metal layer may be formed by the electroless plating by treatment with an electroless plating solution including the above-described reducing agent and the conductive metal ions, and the like.

As the reducing or the plating step is carried out, the first or the second metal ions included in the metal nucleus may be reduced, or the conductive metal ions included in the electroless plating solution are chemically reduced in the region where the metal nucleus is formed as a seed, and therefore, an excellent conductive pattern may be selectively formed on the predetermined region. Here, the metal nucleus and the adhesion-activated surface may form a strong bonding with the chemically reduced conductive metal ions, and as a result, the conductive pattern may be more easily formed selectively on the predetermined region.

Further, since in the resin structure (polymeric resin) on which the conductive pattern is formed, the flame retardant of appropriate kind, amount and the like is uniformly dispersed, the resin structure formed by the above-described method may exhibit excellent flame retardancy, and due to reduced decomposition of the polymeric resin by the addition of the flame retardant, maintain excellent physical properties.

Meanwhile, according to still another embodiment, there is provided a resin structure having the conductive pattern which is obtained by using the composition for forming the conductive pattern and the method for forming the conductive pattern as described above. The resin structure may include a polymeric resin substrate; non-conductive metal compound including a first metal element and a second metal element, having a R$\overline{3}$m or P6$_3$/mmc space group in crystal structure, and dispersed in the polymeric resin substrate; a flame retardant dispersed in the polymeric resin substrate; an adhesion-activated surface including a metal nucleus including a first or a second metal element or an ion thereof exposed on a surface of a predetermined region of the polymeric resin substrate; and a conductive metal layer formed on the adhesion-activated surface.

In the resin structure, the predetermined region in which the adhesion-activated surface and the conductive metal layer are formed may correspond to the region of the polymeric resin substrate to which the electromagnetic wave is irradiated. In addition, the first or second metal element or the ion thereof included in the metal nucleus of the adhesion-activated surface may be derived from the non-conductive metal compound particles. Meanwhile, the conductive metal layer may be derived from the first or second metal element or from the conductive metal ions included in the electroless plating solution.

Meanwhile, in the resin structure, the conductive metal layer is formed by using the non-conductive metal compound having the above-described specific three-dimensional structure, and the like, such that the conductive metal layer may be formed on the polymeric resin substrate with improved adhesion strength. For example, the conductive metal layer may be formed on the polymeric resin substrate by excellent adhesion strength at which a delamination area of the metal layer is 0% (ISO Class 0 grade), or more than 0% to 5% or less (ISO Class 1 grade), of an area of a target metal layer under test, when tested according to the ISO 2409 standard.

Further, as the resin structure includes the flame retardant as previously described as an appropriate kind, and in an appropriate amount, it may exhibit excellent flame retardancy, for example, a flame retardant grade of UV 94-V0 or V1 (thickness (t) is 0.6 to 1.6 mm).

In addition, the resin structure may further include residues which are dispersed in the polymeric resin substrate and derived from the non-conductive metal compound. These residues may have a structure in which at least a part of the first or second metal is released from the three-dimensional structure of the non-conductive metal compound to form vacancy in at least a portion of the released position.

The above described resin structure may become various resin products or resin layers such as a mobile phone case having the conductive pattern for an antenna, or may become various resin products or resin layers having the conductive pattern, such as RFID tags, various sensors, MEMS structures, or the like. Particularly, since the resin structure exhibits excellent flame retardancy while having only small reduced physical properties, and maintaining excellent physical properties, it may be appropriately applied to the products requiring excellent flame retardancy, such as antennas of a laptop, a tablet PC, a mobile phone, a personal computer, and the like.

Hereinafter, the operation and the effect of the invention are described in more detail with reference to specific Examples of the present invention. However, these Examples are illustrative only, and are not intended to limit the scope of the present invention.

Preparation Example 1: Synthesis of Non-Conductive Metal Compound CuCrO$_2$

Raw materials, CuO and Cr$_2$O$_3$ were uniformly mixed with each other at a molar ratio of 2:1 by ball milling for 6 hours. Thereafter, the mixture was calcined under conditions of atmospheric pressure and 1050° C. for 2 hours to synthesize powders having Chemical Formula of CuCrO$_2$. After the synthesis, CuCrO$_2$ powders having controlled particle size to be used in the following Examples were prepared by controlling milling time for comminution process. An electron micrograph and an X-ray diffraction pattern of the CuCrO$_2$ powder are shown in FIGS. 4 and 5, respectively.

The electron microscope and X-ray diffraction analysis showed that the non-conductive metal compound has a flat-type crystal structure, and the layered three-dimensional structure (a $R\bar{3}m$ or $P6_3/mmc$ space group in crystal structure) as illustrated in FIG. 1.

Examples 1 to 3: Formation of Conductive Pattern by Direct Laser Irradiation

A composition for forming a conductive pattern by electromagnetic wave irradiation was prepared by using a polycarbonate resin as a base resin, non-conductive metal compound particles ($CuCrO_2$; average particle size: 0.5 µm) obtained by Preparation Example 1 as an LDS additive, together with additives for the process and stabilization.

As the additives, trialkyl phosphate as a commercialized flame retardant, a heat stabilizer (IR1076, PEP36), a UV stabilizer (UV329), a lubricant (EP184), and an impact modifier (S2001) were used.

As shown in Table 1 below, 79 to 84 wt % of the polycarbonate resin, and 3 to 5 wt % of the LDS additive of the Preparation Example 1 ($CuCrO_2$; average particle size: 0.5 µm) were used, and 6 to 11 wt % of the flame retardant, 4 wt % of the impact modifier, and 1 wt % of other additives including the lubricant were added to be mixed to obtain the composition, which was extruded by an extruder at a temperature of 260 to 280° C. The extruded pellet-type resin structure was subjected to injection molding at approximately 260 to 270° C. to obtain a substrate having a diameter of 100 mm and a thickness of 2 mm as an izod bar type according to ASTM standard.

The resin structure thus obtained of Example 1 was subjected to X-ray diffraction analysis (XRD) and the analysis results thereof are shown in FIG. 6. In addition, distribution of the non-conductive metal compound in the substrate was analyzed by electron microscope and the analysis results thereof are shown in FIG. 7. For reference, FIG. 7 is an electron micrograph of the fracture surface of the substrate, and the right image of FIG. 7 is a partial enlarged view of the left image. Referring to FIGS. 6 and 7, it was confirmed that the non-conductive metal compound was favorably dispersed in the polycarbonate resin without decomposition, before laser irradiation (FIG. 6), and these non-conductive metal compounds were uniformly dispersed in the polycarbonate resin in a particle state (FIG. 7).

Meanwhile, the resin structure as manufactured above was irradiated by laser having a wavelength of 1064 nm under the conditions of 40 kHz and 10 W using Nd-YAG laser so as to activate the surface. After laser irradiation, whether or not the copper-containing metal nucleus is formed in the polycarbonate resin was analyzed and confirmed by an electron micrograph and XRD of the resin structure of Example 1, and results thereof are shown in FIGS. 8 and 9, respectively. Referring to FIGS. 8 and 9, it was confirmed that after laser irradiation, a part of Cu or an ion thereof derived from the $CuCrO_2$ particles was reduced to form the metal seed (that is, the metal nucleus), and to form the adhesion-activated surface including the metal nucleus and large roughness.

Subsequently, the resin structure of which surface was activated by laser irradiation was subjected to an electroless plating process as follows.

The plating solution (hereinafter, referred to as PA solution) was prepared by dissolving 3 g of copper sulfate, 14 g of Rochelle salt, and 4 g of sodium hydroxide in 100 ml of deionized water. To 40 ml of the thus prepared PA solution, 1.6 ml of formaldehyde as a reducing agent was added. The resin structure of which surface was activated by laser was immersed in the plating solution for 4 to 5 hours, and then washed with distilled water. Adhesion performance of the conductive pattern (plating layer) thus formed was evaluated according to the ISO 2409 standard. In addition, the flame retardancy of the finally formed substrate having the conductive pattern was evaluated by UV 94 V grade.

The specific compositions of the Examples 1 to 3, and the results of measurement and evaluation of each physical property as described below, are shown in following Tables 1 and 2.

Comparative Example 1

A substrate having the conductive pattern was formed in the same manner as in Examples 1 to 3, except for that the LDS additive (non-conductive metal compound; average particle size: 0.5 µm) was not used, and the compositions described in following Table 1 were used.

The specific compositions of the Comparative Example 1, and the results of measurement and evaluation of each physical property as described below, are shown in following Tables 1 and 2.

Comparative Example 2: Formation of Conductive Pattern by Direct Laser Irradiation A composition for forming the conductive pattern was prepared in the same manner as in Example 1, except for that $CuNiO_2$ having an average particle size of 0.5 µm was used as the non-conductive metal compound, instead of $CuCrO_2$, and the laser was differently irradiated at power of 3 W, instead of 10 W, and a substrate having the conductive pattern was formed from the composition.

The specific compositions of the Comparative Example 2, and the results of measurement and evaluation of each physical property as described below, are shown in following Tables 1 and 2.

Meanwhile, in Comparative Example 2, after laser irradiation, whether or not the copper-containing metal nucleus is formed in the polycarbonate resin was analyzed and confirmed by an electron micrograph and XRD and results thereof are shown in FIGS. 10 and 11, respectively. Referring to FIGS. 10 and 11, since the laser irradiation conditions were inappropriate even after laser irradiation, the non-conductive metal compound was hardly exposed to the laser, and also sensitivity of the non-conductive metal compound to the laser was not sufficient, and thus no metal seed (that is, metal nucleus) derived from Cu, and the like was formed.

Experimental Example 1: Evaluation on Reflectivity of Resin Structure to Laser and Evaluation on Adhesion Strength of Conductive Pattern First, in Examples 1 to 3 and Comparative Examples 1 and 2, reflectivity to the laser with a wavelength of 1064 nm in the resin substrate immediately before laser irradiation was measured using a UV-vis-NIR spectrometer. The measurement results are summarized in following Table 2.

Referring to Table 2 below, it was found that the substrates of Examples 1 to 3 showed relatively low reflectivity to the laser, indicating high absorption and sensitivity to the laser, whereas the substrate of Comparative Examples 1 and 2 showed high reflectivity, that is, low absorption and sensitivity to the laser. It was confirmed therefrom that formation of the metal nucleus and better conductive pattern is possible by using the compositions of Examples, as compared to the composition of Comparative Examples 1 and 2.

Then, after the conductive pattern was formed in Examples 1 to 3 and Comparative Examples 1 and 2, adhesion strength of each conductive pattern with respect to the polymeric resin substrate was evaluated as an evaluation on a delamination degree using a predetermined tape according to the ISO 2409 standard.

As a result of the evaluation, the adhesion strength was rated according to the delaminated area of the conductive pattern, under the following ISO class standard.

1. Class 0 grade: When the delaminated area of the conductive pattern is 0% of area of target conductive pattern under evaluation.
2. Class 1 grade: When the delaminated area of the conductive pattern is more than 0% to 5% or less of area of target conductive pattern under evaluation.
3. Class 2 grade: When the delaminated area of the conductive pattern is more than 5% to 15% or less of area of target conductive pattern under evaluation.
4. Class 3 grade: When the delaminated area of the conductive pattern is more than 15% to 35% or less of area of target conductive pattern under evaluation.
5. Class 4 grade: When the delaminated area of the conductive pattern is more than 35% to 65% or less of area of target conductive pattern under evaluation.
6. Class 5 grade: When the delaminated area of the conductive pattern is more than 65% of area of target conductive pattern under evaluation.

The results of the evaluation on adhesion strength of the conductive pattern are as shown in following Table 2.

Experimental Example 2: Evaluation on Flame Retardancy of Resin Structure

After the conductive patterns were formed in Examples 1 to 3 and Comparative Examples 1 and 2, the specimen thereof (thickness: 1 mm) was evaluated on the flame retardancy, in the following method.

UV 94 V test method (Vertical Burning Test): Each specimen was set vertically, and a burner was fired. The time for the fire on the specimen to go out spontaneously within a certain time, was measured, and the flame retardancy was evaluated according to the following standard.

UV 94 V0: After firing with the burner for 10 seconds, the burner was removed. The time from ignition to going out for the fire on the specimen (burning time of the specimen) was within 10 seconds. When five specimens were grouped into one set, the same experiments were carried out for 10 times, and the burning time for each set was within 50 seconds. Further, a cotton ball placed 30 cm below was not ignited by sparks falling upon burning.

UV 94 V1: After firing with the burner for 10 seconds, the burner was removed. The time from ignition to going out for the fire on the specimen (burning time of the specimen) was within 30 seconds. When five specimens were grouped into one set, the same experiments were carried out for 10 times, and the burning time for each set was within 250 seconds. Further, a cotton ball placed 30 cm below was not ignited by sparks falling upon burning.

UV 94 V2: After firing with the burner for 10 seconds, the burner was removed. The time from ignition to going out for the fire on the specimen (burning time of the specimen) was within 30 seconds. When five specimens were grouped into one set, the same experiments were carried out for 10 times, and the burning time for each set was within 250 seconds. However, a cotton ball placed 30 cm below may be ignited by sparks falling upon burning.

UV 94 V5: After installing the burner at an angle of 20 degrees, the specimens were ignited under the same conditions as described above. Five specimens were grouped into one set, and the same experiments were carried out for 5 times. The burning time of each set was within 60 seconds, and no spark was melted and fell upon burning.

The results of the measurement and the evaluation on the flame retardancy are as shown in following Table 2.

Experimental Example 3: Evaluation of Resin Structure on Mechanical Properties

The impact strength of the resin structures of Examples 1 to 3, and Comparative Examples 1 and 2 was measured according to the ASTM D256 standard, and the results of the measurement are as shown in following Table 2.

TABLE 1

|  | Example 1 | Example 2 | Example 3 | Comparative Example 1 | Comparative Example 2 |
|---|---|---|---|---|---|
| PC [wt %] | 79 | 84 | 81 | 84 | 79 |
| Flame retardant [wt %] | 11 | 6 | 11 | 11 | 11 |
| LDS additive [wt %] | 5 ($CuCrO_2$) | 5 ($CuCrO_2$) | 3 ($CuCrO_2$) | — | 5 ($CuNiO_2$) |
| Impact modifier [wt %] | 4 | 4 | 4 | 4 | 4 |
| Other additives [lubricant, etc., wt %] | 1 | 1 | 1 | 1 | 1 |

TABLE 2

|  | Example 1 | Example 2 | Example 3 | Comparative Example 1 | Comparative Example 2 |
|---|---|---|---|---|---|
| Laser irradiation average power [W] | 10 | 10 | 10 | 10 | 3 |
| Laser reflectancy [%, at 1064 nm] | 19.3 | 20.1 | 21.1 | 35.5 | 30.5 |
| Conductive pattern adhesive strength [ISO class] | 0 | 0 | 1 | 5 | 5 |
| Flame retardancy [UV 94 V] | V0 | V1 | V0 | V1 | V0 |
| IZOD notch impact strength [J/cm] | 5.4 | 6.4 | 4.7 | 6.8 | 4.5 |

As shown in Table 2 above, in Examples 1 to 3, the area of the delaminated conductive pattern of the entire area in which the conductive pattern is formed was significantly small, such that the adhesion strength was evaluated as class 0 or 1 grade, and therefore, it was confirmed that the conductive pattern has excellent adhesion strength with respect to the polymeric resin substrate. In comparison, in Comparative Examples 1 and 2, it was confirmed that the formed conductive pattern has low adhesion strength, so that the delamination of the conductive layer easily occurred.

In addition, in Examples 1 to 3, it was confirmed that the mechanical properties such as impact strength correspond to PC of Comparative Example 1.

Further, referring to Table 2 above, it was confirmed that the resin structures of the Examples show excellent flame retardancy.

The invention claimed is:

1. A composition for forming a conductive pattern by electromagnetic irradiation, comprising: a polymer resin; a non-conductive metal compound having a layered three dimensional structure and including a first metal element and a second metal element, having a R3m or $P6_3/mmc$ space group in crystal structure, the structure comprising: a plurality of first layers including at least one metal of the first metal element selected from the group consisting of Cr, Mo, Mn, Fe, Sn and W, and a second layer including at least one metal of the second metal element selected from the group consisting of Cu, Ag and Ni and arranged between the first layers, wherein the non-conductive metal compound has a general formula $ABX_2$ where A is selected from the group consisting of Cu, Ag and Ni, B is selected from the group consisting of Cr, Mo, Mn, Fe, Sn and W, and X is oxygen, nitrogen, or sulfur; and a flame retardant, wherein a metal nucleus including the first metal element, the second meta element or an ion thereof is formed from the non-conductive metal compound by the electromagnetic irradiation.

2. The composition of claim 1, wherein the non-conductive metal compound includes one or more compounds selected from the group consisting of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$ and $CuSnO_2$.

3. The composition of claim 1, wherein it exhibits reflectivity of 25% or less with respect to a laser electromagnetic wave having a wavelength of 1000 nm to 1200 nm.

4. The composition of claim 1, wherein the metal nucleus is formed by irradiating a laser electromagnetic wave having a wavelength of 1000 nm to 1200 nm at an average power of 5 to 20 W.

5. The composition of claim 1, wherein the polymer resin includes a thermosetting resin or a thermoplastic resin.

6. The composition of claim 5, wherein the polymer resin includes one or more selected from the group consisting of an ABS resin, a polyalkylene terephthalate resin, a polycarbonate resin, a polypropylene resin, and a polyphthalamide resin.

7. The composition of claim 1, wherein the non-conductive metal compound is included in an amount of 0.1 to 10 wt %, with respect to the composition.

8. The composition of claim 1, wherein the flame retardant includes a phosphorus-containing organic flame retardant or an inorganic flame retardant.

9. The composition of claim 8, wherein the phosphorus-containing organic flame retardant includes one or more selected from the group consisting of trialkyl phosphate, alkyldiaryl phosphate, tricryl phosphate and resorcinol bisphenyl phosphate.

10. The composition of claim 8, wherein the inorganic flame retardant includes one or more selected from the group consisting of metal hydrides, antimony oxide and metal sulfonates.

11. The composition of claim 1, wherein the flame retardant is included in an amount of 0.1 to 20 wt %, with respect to the composition.

12. The composition of claim 1, further comprising one or more additives selected from the group consisting of a heat stabilizer, a UV stabilizer, a lubricant, an antioxidant, an inorganic filler, a colorant, an impact modifier, and a functional modifier.

13. The composition of claim 12, wherein the flame retardant includes a phosphorus-containing organic flame retardant, and the inorganic filler or the impact modifier is included as the additive.

14. A resin structure having a conductive pattern, comprising: a polymeric resin substrate; dispersed in the polymeric resin substrate, a non-conductive metal compound including a first metal element and a second metal element, having a R3m or $P6_3/mmc$ space group in crystal structure, the structure comprising a plurality of first layers including at least one metal of the first meta element selected from the group consisting of Cr, Mo, Mn, Fe, Sn and W, and a second layer including at least one metal of the second metal element selected from the group consisting of Cu, Ag and Ni and arranged between the first layers, wherein the non-conductive metal compound has a general formula $ABX_2$ where A is selected from the group consisting of Cu, Ag and Ni, B is selected from the group consisting of Cr, Mo, Mn, Fe, Sn and W, and X is oxygen, nitrogen, or sulfur; a flame retardant dispersed in the polymeric resin substrate; an adhesion-activated surface including a metal nucleus including a first or a second metal or an ion thereof exposed on a surface of a predetermined region of the polymeric resin substrate; and a conductive metal layer formed on the adhesion-activated surface.

15. The resin structure of claim 14, wherein the predetermined region on which the adhesion-activated surface and the conductive metal layer are formed corresponds to a region of the polymeric resin substrate to which an electromagnetic wave is irradiated.

16. The resin structure of claim 14, wherein it exhibits a flame retardant grade of UV 94-V0 or V1 (thickness (t) is 0.6 to 1.6 mm).

17. The resin structure of claim 14, wherein the conductive metal layer is formed on the polymeric resin substrate by adhesion at which a delamination area of the metal layer is 0% (ISO Class 0 grade), or more than 0% to 5% or less (ISO Class 1 grade), of an area of a target metal layer under test, when tested according to ISO 2409 standard.

18. The composition of claim 1, wherein X is nitrogen or sulfur.

19. The resin structure of claim 14, wherein X is nitrogen or sulfur.

* * * * *